United States Patent [19]

Gloton

[11] Patent Number: 4,914,057
[45] Date of Patent: Apr. 3, 1990

[54] CONTACTING METHOD AND STRUCTURE FOR INTEGRATED CIRCUIT PADS

[75] Inventor: Jean-Pierre Gloton, Aix En Provence, France

[73] Assignee: SGS-Thomson Microelectronics S.A., Gentilly, France

[21] Appl. No.: 323,604

[22] Filed: Jul. 15, 1988

[30] Foreign Application Priority Data

Jul. 16, 1987 [FR] France ................. 87 10413

[51] Int. Cl.$^4$ ............................................. H01L 21/44
[52] U.S. Cl. ................................ 437/193; 437/183; 437/194
[58] Field of Search ............. 437/183, 193, 194

[56] References Cited

U.S. PATENT DOCUMENTS

| 3,667,008 | 5/1972 | Katnack | 437/193 |
| 3,806,361 | 4/1974 | Lehner | 437/193 |
| 4,442,966 | 4/1984 | Jourdian et al. | |
| 4,666,737 | 5/1987 | Gimpelson et al. | 437/245 |

FOREIGN PATENT DOCUMENTS

| 2658302 | 7/1977 | Fed. Rep. of Germany. |
| 2492164 | 4/1982 | France. |
| 1525148 | 9/1978 | United Kingdom. |

OTHER PUBLICATIONS

Patent Abstracts of Japan, vol. 9, No. 250 (E-353) [1993], Oct. 26, 1985.

Primary Examiner—Brian E. Hearn
Assistant Examiner—Laura M. Holtzman
Attorney, Agent, or Firm—Lowe, Price, LeBlanc, Becker & Shur

[57] ABSTRACT

The instant invention relates to a process for forming protruding contacts on an integrated circuit aluminum pad, comprising the following steps: providing beneath the aluminum pad (21) a conductive polycrystalline silicone layer (23); locally removing the aluminum layer for uncovering a portion of the surface of the polycrystalline silicon layer; establishing a connection with the polycrystalline silicon layer by means of a drop of conductive adhesive (30).

2 Claims, 2 Drawing Sheets

CONTACTING METHOD AND STRUCTURE FOR INTEGRATED CIRCUIT PADS

TECHNICAL FIELD

The instant invention relates to a contacting method and structure for integrated circuit pads. It specially applies whenever this contact has to be carried out by means of projections formed onto those pads.

BACKGROUND OF THE INVENTION

Generally in the field of semiconductor integrated circuits, aluminum layers are used as connection layer(s). Indeed, aluminum is a very good current conductor, easy to deposit, even onto surfaces having uneven protrusions, easy to etch and relatively cheap. Those aluminum connection layers are ended with pads, generally square-shaped, positioned at the periphery of the integrated circuit chip for establishing a contact with external connections.

One is then faced with a problem since aluminum is highly oxidizable and often forms insulating intermetallic compounds with other conductive materials. Therefore, various contact technologies have been developed, wherein adapted multilayer conductive structures are first deposited onto the aluminum pads.

The problem is particularly critical when, onto those aluminum pads, one wishes to carry out conductive bosses such as the ones that are used for example in the process called TAB. According to this process, outer connection metallizations are formed onto a film that is analog to the cinematography films; metallization portions onto those films, or beams, being then applied against the bosses of the integrated circuit which appear through a window opened into the film so that those bosses are positioned in front of the extremities of the beams.

A conventional process according to the prior art for carrying out such bosses consists in uniformly depositing onto an integrated circuit, wherein apertures are made above the aluminum pads, a sputtering of TiW then of gold. Later, a layer of resin is uniformly deposited onto the chip and windows are opened at the locations of the pads. A thick gold plating (from 0.02 to 0.03 mm) is carried out. The resin is then etched and the layer of TiW+Au is removed by ionic etching at the locations other than those were the bosses are formed.

The TiW+Au deposit and suppression operations are particularly complex steps which require a costly equipment. Thus, generally, the manufacturers of semiconductor integrated circuits, who are not liable to frequently use projecting contacts (bosses), for example for TAB, instead of highly investing into the necessary equipment, sub-contract the boss manufacturing operations. This also involves a substantial increase of the integrated circuit cost.

SUMMARY OF THE INVENTION

Therefore, an object of the instant invention is to provide for a new type of contact onto an aluminum pad which is particularly easy to implement and which does not require a complex technology with respect to the conventional technologies generally used in the field of the manufacturing of semiconductor integrated circuits.

A further object of the instant invention is to provide for such a process particularly adapted to the formation of projecting contacts.

In order to achieve those objects, the basic idea of the instant invention which contrasts with the prior art habits is, since it is difficult to establish a contact with an aluminum layer, to position under this aluminum layer an additional layer with which it is easy to obtain a contact and the contact is established with this lower layer which insures the electrical connection with the aluminum layer.

Thus, the process of forming a contact onto an aluminum pad of an integrated circuit according to the present invention comprises the following steps: providing beneath the aluminum pad a conductive underlayer constituted by a material insuring a good electrical contact with aluminum; locally removing the aluminum layer for uncovering a portion of the underlayer surface; and establishing a connection with the underlayer. Said underlayer may have, according to the case, a surface lower, equal or larger than that of the pad.

According to an embodiment of the instant invention, said underlayer is constituted by a doped polycrystalline silicon layer.

According to a further an embodiment of the instant invention, the connection with the apparent surface of the polycrystalline silicon layer is established by means of a drop of conductive adhesive.

Thus, a contact pad of the integrated circuit according to the instant invention comprises a polycrystalline silicon layer which is at least partially overlaid with an aluminum layer comprising extensions that establish connections with the integrated circuit.

BRIEF DESCRIPTION OF THE DRAWINGS

Other features and advantages of the instant invention will clearly appear from the following detailed description of preferred embodiments, in connection with the attached drawings, wherein:

FIG. 3A being a view according to line IIIA—IIIA of FIG. 3B.

In those various drawings, the layer sizes and thicknesses are not drawn to scale for the sake of simplicity, as it is conventional in the field of the representation of semiconductor circuits.

Figure 1:
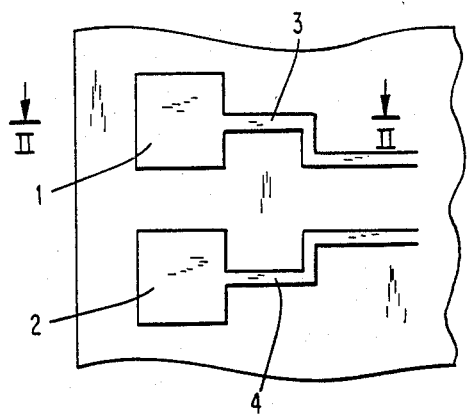
FIG. 1 shows a top view of conventional contact pads of an integrated circuit.

FIG. 1 shows a partial top view of an integrated circuit edge comprising aluminum contact pads 1 and 2. Generally, those aluminum contact pads are integral with the aluminum connection stripes 3 and 4 establishing contacts on choosen locations of the integrated circuit. However, for certain pads, there may be no connection stripe, the pad being designed for establishing a contact with the underlying substrate.

Figure 2A:
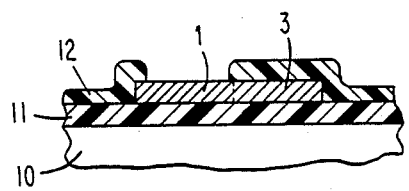
FIGS. 2A and 2B show two examplary cross-sections according to line II—II of FIG. 1.
Figure 2B:
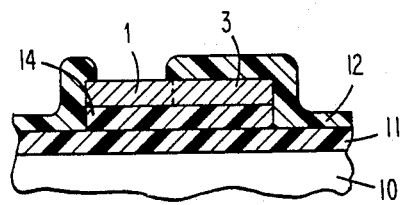

FIGS. 2A and 2B show two examplary cross section views according to line II—II of FIG. 1.

In FIG. 2A, the aluminum layer 1, 3 is deposited onto an insulating layer 11 formed on a semiconductor substrate 10, this insulating layer usually being a thick layer of silicon oxide (having a thickness over one micrometer), also called oxide layer. Later, in most implementations of integrated circuit, a thick layer (several micrometers) of an insulating material, for example silica doped with phosphorous 12, is deposited onto the whole integrated circuit and windows are opened above the contact pad 1. It is inside those windows that one tries to establish contacts towards the integrated circuit from the outside.

FIG. 2B shows another examplary cross section view of the structure shown in FIG. 1. The difference between FIGS. 2B and 2A lies in the fact that in FIG. 2B a conductive layer of polycrystalline silicon is present beneath the aluminum layers. Such a configuration is systematically used for reasons which will not be disclosed here in some manufacturing technologies of integrated circuits. However, in the prior art, even in case such a polycrystalline silicon layer 14 is present beneath the areas of aluminum pads contacts are however established by means of a metallurgic process of contact with aluminum as in case such an underlayer is not present.

Figure 3A:
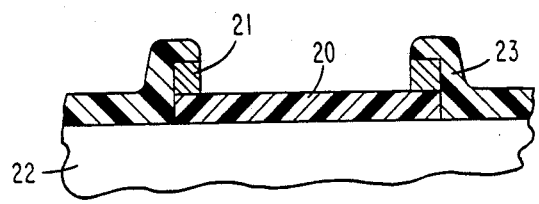
FIGS. 3A and 3B show a cross section view and a top view of a contact structure according to the instant invention.
Figure 3B:
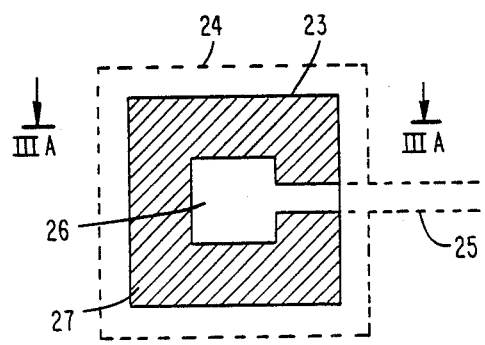

FIGS. 3A and 3B show an example of the contact structure according to the instant invention. As shown in FIG. 3A, this contact structure systematically comprises a layer of conductive, highly doped, polycrystalline silicon 20, beneath an aluminum layer 21. This aluminum layer is open in order to uncover at the surface a substantial portion of the polycrystalline silicon layer 20. The polycrystalline silicon layer 20 lies on a substrate 22 which can be either directly a silicon substrate if one tries to establish a contact with the latter, or an insulating layer, for example a layer of thick $SiO_2$ deposited onto a silicon wafer.

Then, the pad according to the instant invention can be connected by any conventional means for establishing a connection with polycrystalline silicon, this connection being then much easier to carry out than with aluminum. FIG. 3A also shows an upper passivating layer 23 open at the locations where the contact is to be established.

FIG. 3B is a top view permitting to better see the limits of the various layers. Reference 23 designates the limit of the upper passivating layer, the dotted line 24 designates the external limit of the aluminum layer 21 which, in the given example, slightly extends beneath the passivating layer 23 and is extended by a connection stripe 25. Furthermore, in the example shown in FIG. 3B, the aluminum layer 21 is not entirely etched inside the outline determined by the mask 23 but a central aluminum area 26 has been left, only a cross-hatched portion 27 of the polycrystalline silicon 20 being apparent. This inner aluminum region 26 is designed for increasing the contact surface between the polycrystalline silicon and aluminum in order to take into account that doped polycrystalline silicon is not as good a conductive material as aluminum. Then, any contacting process onto doped polycrystalline silicon can be used.

Figure 4:
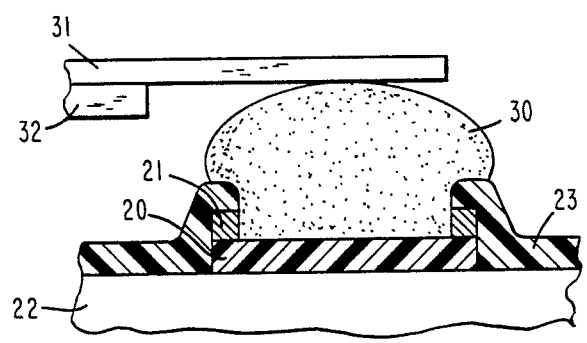
FIG. 4 shows a cross section view of a projection set associated with a contact structure according to the present invention.

FIG. 4 shows a preferred embodiment in case one wishes to carry out bosses and a TAB set.

FIG. 4 shows a particularly simple connection to a contact pad according to the instant invention. On the structure shown in FIG. 3A and designated in FIG. 4 by the same references, a drop of conductive adhesive 30 is deposited. This permits, for example, to establish a connection with a beam 31 protruding from a support film 32 according to the TAB process. Furthermore, the adhesive also permits to insure the fastening with the beam. An additional advantage with this type of circuit is, even if the beams 31 are not positioned in the same horizontal plane, to permit a slight penetration into the adhesive 30 if one works at a temperature and at a state when this adhesive is still viscous.

As a conductive adhesive 30, one can use a material, the carrier of which is, for example, silicon, epoxy, polyimide or glass, and wherein the conductive filler is silver, gold, paladium, etc.

It will be noted that this particularly simple use of a drop of adhesive would not be possible for a pad having an apparent aluminum surface, the conductive interfaces adhesive-aluminum having a high resistivity.

A circuit according to the invention, for example as shown in FIG. 4, is particularly well adapted when the integrated circuits comprise few terminals, for example in case of integrated circuits used in memory cards such as bank cards, telephone cards, etc., those cards being commonly called "chip carrying cards".

Of course, the preferred embodiment shown in FIG. 4 is only a particular embodiment of the instant invention and any known process of connection onto polycrystalline silicon can be used, for example an alloy. Generally speaking, the invention also includes the general process which consists in providing for a connection pad comprising, beneath an aluminum layer, a conductive underlayer with which a contact is effectively carried out. Said underlayer could, for example, be constituted of nickel, copper, conductive glass, etc.

I claim:

1. A method for contacting an integrated circuit aluminum pad, comprising the following steps: providing beneath the aluminum a conductive underlayer constituted of a material ensuring a good electrical contact with aluminum; locally removing the aluminum layer for uncovering a portion of the underlayer surface; and establishing a connection with the underlayer by means of a drop of conductive adhesive.

2. A method for forming projection contacts onto an integrated circuit aluminum pad, comprising the following steps:
   providing beneath the aluminum pad a conductive polycrystalline silicon layer;
   locally removing the aluminum layer for uncovering a portion of the polycrystalline silicon layer surface; and
   establishing a connection with the polycrystalline silicon layer by means of a drop of conductive adhesive.

* * * * *